MONATOMIC SEMICONDUCTOR DEVICES

Filed April 29, 1952

INVENTOR.
RALPH P. JOHNSON,
BY ROBERT G. SHULMAN,
DELBERT M. VAN WINKLE,
Seymour M. Rosenberg
ATTORNEY.

United States Patent Office
2,743,201
Patented Apr. 24, 1956

2,743,201

MONATOMIC SEMICONDUCTOR DEVICES

Ralph P. Johnson, Playa Del Rey, Robert G. Shulman, Los Angeles, and Delbert M. Van Winkle, Tarzana, Calif., assignors, by mesne assignments, to Hughes Aircraft Company, a corporation of Delaware Application April 29, 1952, Serial No. 285,028

3 Claims. (Cl. 148—1.5)

The present invention relates to monatomic semiconductor devices and more particularly to rectifying junctions in monatomic semiconductors and methods of making such junctions.

Monatomic semiconductors, such as germanium and silicon, have been found to be extremely useful as devices for translating or controlling electromagnetic energy, such as light energy and electrical signals. In particular, these semiconductors have been utilized, in the prior art, for sensing light energy, and for generating, amplifying, and modulating electric signals.

The recent prior art has developed a new class of monatomic semiconductors in which a rectifying junction exists in the semiconductor material, the rectifying junction being defined as a unidirectional high-resistance barrier region between two portions of the semiconductor of respectively opposite conductivity type. In this new class of semiconductors, the crystal structure of the base material, that is the germanium or silicon, is continuous across the rectifying junction, while the concentration of active impurities is substantially discontinuous at the junction. Semiconductors of this class have been termed P-N junction semiconductors.

The term "active impurities" is used to denote those impurities which affect the electrical rectification characteristics of the base material, as distinguishable from other impurities which have no appreciable effect upon these characteristics. Generally, active impurities are added intentionally to the base material, although, in many instances, certain of these impurities may be found in the original base material. Active impurities are classfied as either donors, such as antimony, arsenic or phosphorous, or acceptors, such as indium, gallium, and aluminum.

Junction type semiconductor devices may have a single rectifying junction or multiple rectifying junctions. Both types of semiconductor devices have been found to be extremely useful in the prior art. For example, the single rectifying junction semiconductor may be used as a single rectifier or diode, while a two-junction semiconductor may be used as a transistor.

In the prior art, rectifying junctions in semiconductors which comprise a single crystal have been produced during the process of growing a single crystal from a melt of the base material. According to this prior art method, a seed crystal is brought into contact with the surface of a melt of the base material, and is then withdrawn from the melt at such a rate as to maintain the boundary between the growing solid crystal and the liquid melt substantially planar. When the crystal has grown to a suitable length, the desired active impurity is added to the melt. Thereafter, as the crystal continues to grow it incorporates a quantity of the active impurity, and a rectifying junction is formed at the interface between the solid and the liquid at the time the impurity is added to the melt. If an additional rectifying junction is desired, an impurity of the opposite class may be added to the melt after the crystal incorporating the first-named impurity has grown to a suitable length.

This prior art method of producing P-N junctions in semiconductors has several inherent limitations. Firstly, it is not readily adaptable to rapid production, since the rate of withdrawal of the crystal is limited by temperature factors and by the condition that the boundary between the crystal and the melt should remain substantially planar. Secondly, the concentration of active impurities in the melt is the only parameter which can be used to control the impurity concentration in the completed junction. Thirdly, it is impossible to produce a semiconductor device having identical active impurity concentrations in the regions of different conductivity types since the active impurity concentration of the melt is changed by doping each time a rectifying junction is desired in the growing crystal.

In producing an N-P-N transistor device, for example, a first end region of the device is grown as a crystal from a melt of N-type germanium substantially free of acceptor impurities. When the end region has reached a suitable length, an acceptor impurity is added to the melt in sufficient quantity to change the melt to P-type germanium. As the crystal continues to grow thereafter, a region of P-type germanium is produced which includes both acceptor and donor impurities, since the original donor impurities which produced the original N-type melt cannot be removed during the crystal growing process. When it is desired to reconvert the melt to N-type germanium to grow the second end region of the transistor, the melt must be doped with a donor impurity in sufficient quantity to overcome the effect of the acceptor impurity which was added in order to produce the P-type region. It is clear, therefore, that the active impurity concentrations of each of the three regions of the transistor differ from that of the other two regions, since overdoping of the melt is the only feasible method for changing the melt from one type of germanium to the other.

These and other disadvantages of the prior art semiconductor junctions and methods for producing them are obviated by the methods of the present invention which produce P-N junction semiconductors having preselected active impurity concentrations in the P-type and N-type regions and narrow and planar rectifying barrier regions therebetween. According to the present invention, two or more semiconductor specimens having preselected active impurity concentrations are placed in contact with each other and are coalesced at the contacting interface therebetween, or, stated differently, are atomically joined by an atomic rearrangement of the portions of the specimens adjacent the interface.

The semiconductors thus produced have an active impurity concentration which is controlled by the active impurity concentration selected for the starting specimens. In other words, by selecting N-type starting specimens which have a predetermined concentration of a donor impurity and are substantially free of acceptor impurities, and by selecting P-type starting specimens which have a predetermined concentration of an acceptor impurity and are substantially free of donor impurities, junction-type semiconductors may be produced having N-type and P-type regions which are substantially free of acceptor and donor impurities, respectively.

In order to insure a narrow rectification barrier between the specimens and thereby obtain good electrical characteristics in the completed junctions, the semiconductor specimens are coalesced only in the immediate vicinity of the contacting interface of the specimens. Coalescence is effected by applying pressure to the specimens perpendicular to their contacting interface and then heating the specimens to a value of temperature, below the normal melting point of the semiconductor specimens, whereat coalescence of the specimens occurs immediately adjacent the interface. More particularly, in the preferred method of this invention, coalescence of the specimens is produced by local melting of the specimens immediately adjacent the interface, thereby fusing the specimens together.

According to the present invention, junctions may be produced between starting specimens which are single crystals or polycrystalline in structure. In addition, the junction-type semiconductors produced may have single or multiple rectification barriers, as in semiconductor diodes and transistors, respectively. Moreover, the methods herein disclosed are equally applicable to semiconductor wafers as starting specimens, thereby producing relatively large P-N junction semiconductors which may be cut or diced as desired in order to produce a plurality of smaller P-N junction semiconductors.

It is, therefore, an object of this invention to provide P-N junction semiconductors having P-type and N-type regions of preselected active impurity concentrations, and methods for making said junctions.

A further object of this invention is to provide methods for producing junction-type semiconductors of preselected active impurity concentration by coalescing a plurality of preselected semiconductor specimens at the contacting interfaces of the specimens.

Another object of this invention is to provide methods for joining two semiconductor specimens of opposite conductivity type to form a rectifying junction therebetween by coalescing the specimens at a contacting interface of the specimens.

It is another object of this invention to provide methods for fusing together a plurality of semiconductor specimens of opposite conductivity types and establishing rectification barriers therebetween.

It is also an object of this invention to provide methods for producing semiconductor junctions by forcing a first semiconductor specimen against a second semiconductor specimen and heating the specimens until local melting occurs at their respective interface.

Another object of this invention is to provide junction-type semiconductor devices having P-type and N-type regions substantially free of donor and acceptor impurities, respectively.

Still another object of this invention is to provide junction-type semiconductors having regions of opposite conductivity types and in which the active impurity concentrations of the different regions are of the same order of magnitude.

It is still further an object of the present invention to provide junction-type semiconductors which comprise a first semiconductor specimen of preselected active impurity concentration coalesced with a second semiconductor specimen of preselected active impurity concentration.

An additional object of this invention is to provide semiconductor devices which include a plurality of semiconductor specimens coalesced at the respective contacting interfaces of the specimens.

Furthermore, it is an object of this invention to provide junction-type transistors having end regions of similar active impurity concentrations.

The novel features which are believed to be characteristic of the invention, both as to its organization and mode of operation, together with further objects and advantages thereof, will be better understood from the following description considered in connection with the accompanying drawings, in which several embodiments of the invention are illustrated by way of examples. It is to be expressly understood, however, that the drawings are for the purpose of illustration and description only, and are not intended as a definition of the limits of the invention.

For purposes of clarity, the invention will be disclosed in connection with the production of junction-type germanium semiconductor devices, it being expressly understood that the invention is equally applicable to the production of devices utilizing silicon as the semiconductor material.

Figures 1, 2:
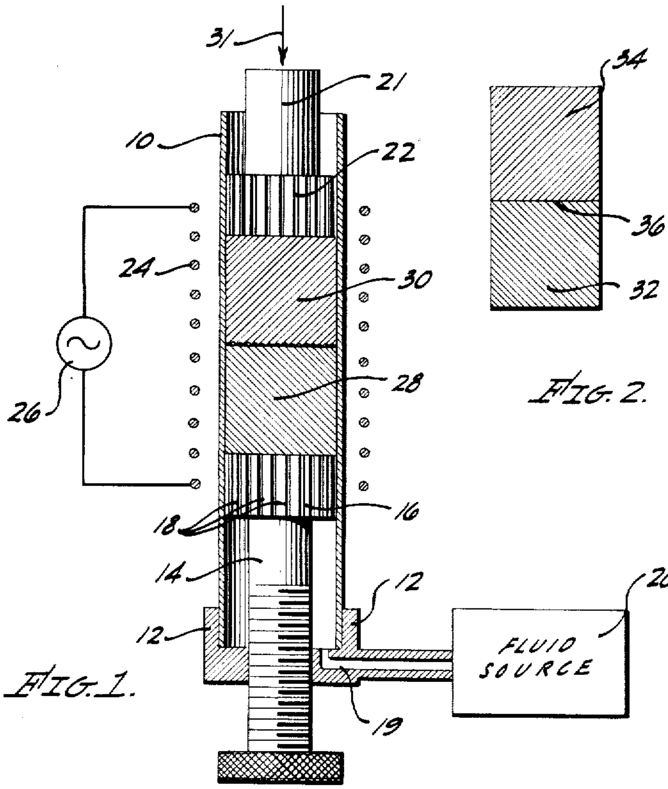
Fig. 1 is a schematic diagram, partly in section, of one form of apparatus for producing junction-type semiconductor devices according to the present invention.
Fig. 2 is a longitudinal sectional view of a P-N junction device produced by the apparatus and method illustrated in Fig. 1.

Referring now to the drawings, wherein like reference characters designate like or corresponding parts throughout the several views, there is shown in Fig. 1 one form of apparatus for producing a P-N junction semiconductor device according to the method of the present invention. The apparatus comprises a tubular element 10, composed of a suitable insulating material such as quartz, one end of element 10 being fastened to a collar 12 having a threaded aperture therein for seating an adjusting stud 14. Fastened to one end of stud 14 is a pressure pad 16 having a diameter approximately equal to the inside diameter of tubular element 10 and having a plurality of axially transverse grooves 18 along the periphery thereof. Collar 12 also includes a port 19 for fluid coupling the interior of tubular element 10 with a source 20 of gas under pressure.

The apparatus also includes a rod 21 to one end of which is attached a second pressure pad 22 having the same general configuration as that of pressure pad 16 and slideable within element 10. An induction or radiant heating coil 24 surrounds tubular element 10 and is coaxial therewith, coil 24 being connected to a suitable source 26 of electrical energy.

In operation, a semiconductor specimen 28 of either N or P-type germanium is inserted in tubular element 10 and brought to rest against pressure pad 16. A second germanium specimen 30, of the type opposite to that of specimen 28, is then inserted in tubular element 10, the lower surface of specimen 30, as viewed in Fig. 1, being placed in contact with the upper surface of specimen 28. Pressure pad 22 and attached rod 21 may then be inserted in tubular element 10 and placed in contact with the upper surface of specimen 30.

The position of specimens 28 and 30 relative to coil 24 may be adjusted by rotation of stud 14, thereby axially moving the specimens and pressure pads 16 and 22 within tubular element 10. After the specimens have been centrally positioned relative to coil 24, a force of predetermined magnitude, schematically illustrated by an arrow 31, is applied to rod 21 thereby forcing specimen 30 against specimen 28. Simultaneously, a suitable gas, such as helium or hydrogen, is supplied by pressure source 20 through port 19 and the grooves of pressure pads 16 and 22 for surrounding the semi-conducter specimens with a protective or non-oxidizing atmosphere during the process of producing the P-N junction semiconductor.

By applying electrical energy from source 26 to coil 24, the temperature of specimens 28 and 30 may be raised to a predetermined value below the normal melting point of germanium, at which value of temperature a local melting of the specimens occurs along the contacting interface of the specimens, thereby fusing specimen 28 and specimen 30 along a narrow barrier region parallel to the interface. By merely permitting the specimen to cool, a P-N junction device, or ingot, such as that shown in Fig. 2, is produced, the device including two regions 32 and 34, respectively, of opposite conductivity types, and a narrow rectification barrier 36 therebetween.

In order to more fully describe the production of a P-N junction device according to the method of the present invention, the local melting phenomenon which occurs along the interface of the germanium specimens with the application of heat and pressure will now be considered in detail.

According to the classical Clausius-Clapeyron equation which relates the pressure and temperature applied to a specimen of an element with the specific heat and differential volume change of the specimen, the melting point of a germanium specimen may be lowered by increased pressure applied to the specimen in accordance with the equation $$dT = 4.96 \times 10^{-4} dp \qquad (1)$$

where $dT$ = decrease in melting point in degrees centigrade $dp$ = pressure applied in kgm./cm.$^2$ $4.96 \times 10^{-4}$ = proportionality constant including the heat of fusion, the fusion temperature, and the isothermic incremental volume change of germanium.

From Equation 1 it would be assumed that the melting point of the germanium specimens shown in Fig. 1 is uniformly lowered throughout the specimens by the application of pressure since it would appear that the pressure in all regions of the specimens is identical. However, this is not the case, for although the cross-sectional areas of specimens 28 and 30 are substantially equal, the contact area between the two specimens, when considered microscopically, is much smaller than the cross-sectional area of the specimens. In other words, since the germanium specimens are not atomically smooth and level, the actual contact area between the specimens comprises a number of extremely small contact points, the total area of which is relatively minute in comparison with the cross-sectional area of the specimen. It is apparent, therefore, that the pressure, or force per unit area, in the vicinity of the contacting interface is larger than the pressure in the other regions of the specimens.

Accordingly, it is clear from Equation 1 that the melting point of the portion of the specimens adjacent the contact areas of the interface is lowered further than the melting point of the other regions of the specimens. By carefully controlling the temperature applied to the germanium specimens, one may, therefore, melt a narrow region of specimens 28 and 30 adjacent the interface, and thereby effect coalescence of the specimens. Moreover, as the germanium adjacent the interface is melted, the contact area between the specimens is increased, thereby decreasing the pressure in the vicinity of the interface and raising the melting point above the temperature applied to the specimens. In this manner, melting of the specimens is limited to the vicinity of the interface and the melted region may resolidify of its own accord.

Although the Clausius-Clapeyron equation is useful for describing the general principle of the methods of the present invention, it is limited by two factors in determining the precise value of temperature which should be applied to the specimens in order to effect local melting along the interface of the specimens. Firstly, it is impractical to foretell with precision the contact area which exists between two germanium specimens which are to be joined to form a junction-type semiconductor device and it is, therefore, difficult to calculate the precise pressure in the specimens at the interface. Secondly, the effect of impurities, such as germanium oxide, on the melting point of germanium is such that a precise melting point cannot be attributed to all specimens of germanium, and since the proportionality constant in Equation 1 is dependent upon the melting point, the equation is of limited usefulness. In spite of the fact that the melting point of germanium is generally thought to be 958.5 degrees centigrade, research in recent years has indicated that melting may occur at temperatures below the accepted value, it being generally considered that impurities are responsible for this variation.

For these reasons, the values of pressure and temperature which may be utilized for producing junction-type semiconductor devices by the method of the present invention are most easily determined empirically. In other words, if it is desired to produce junction-type semiconductor devices which utilize starting specimens having a certain cross-sectional area, a force of desired magnitude within the structural limitations of the assembling apparatus may be utilized for applying pressure to the specimens, and the temperature of the specimens raised until local melting and fusion of the specimens occurs in the immediate vicinity of the interface. Having recorded the temperature at which the junction is formed, the method may then be readily carried out in mass production on other specimens of substantially the same size by merely applying the same conditions of pressure and temperature to the specimens. A typical set of values which has been found suitable for producing junction-type semiconductor devices by the method of the present invention is shown below:

| Diameter of Apparent Contact Area of Specimen | Force Applied, kg. | Fusion Temp., ° C. |
|---|---|---|
| 1 mm. | 1 | 948 |

It has been found that when the values of cross-sectional area and force have been maintained with a reasonable degree of accuracy, coalescence of the germanium specimens will occur with a temperature deviation of several degrees from the cited value. It is, therefore, to be expressly understood that these values are merely illustrative and are not intended as a limit to the invention.

The semiconductor devices produced in accordance with the methods disclosed herein exhibit the customary characteristics of this type of device, namely, high forward currents and a good rectification barrier. In addition, the N-type and P-type regions of the completed semiconductor devices have active impurity concentrations which are determined, to a great extent, by the active impurity concentrations of the semiconductor specimens selected for producing the devices. In other words, by utilizing starting specimens each of which has active impurities of only a desired type, and is substantially free of active impurities of the other type, junction-type semiconductor devices may be produced having N-type and P-type regions which have controlled concentrations of donor and acceptor impurities, respectively, and which are substantially free of acceptor and donor impurities, respectively. By thus controlling the active impurities in each region of the semiconductor device, the electrical characteristics of the device may be improved and, moreover, may be predetermined or controlled, thereby permitting mass production of semiconductor devices having similar electrical characteristics. The electrical characteristics of the completed devices may, of course, be improved still further by the conventional annealing and etching processes known to the art.

Although junction-type semiconductor devices may be produced by utilizing germanium specimens which have contacting surfaces that are comparatively coarse, or, on the other hand, approach optical smoothness, it has been found that more uniform results are achieved by controlling the contact area between the specimens more rigorously. One manner which has proven satisfactory in accomplishing this result is to polish the contact surfaces of the specimens to be joined until they approach optical smoothness, and then to roughen one of the surfaces to a predetermined microscopic coarseness by utilizing an abrasive, such as a 600 mesh alumina. It is clear, of course, that the contact area between the germanium specimens may be controlled by utilizing other abrasives or methods, if desired.

It has been found that suitable semiconductor devices may be produced by utilizing germanium specimens each of which is polycrystalline in structure. However, improved electrical characteristics have been obtained by utilizing germanium specimens either or both of which are single crystals. It is considered that optimun electrical characteristics may be obtained by utilizing single crystal specimens in which the crystalline axes of one crystal are crystallographically aligned with the axes of the other crystal prior to joining of the specimens. One method which may be utilized for accomplishing the alignment is the use of well-known X-ray techniques.

Figure 3:
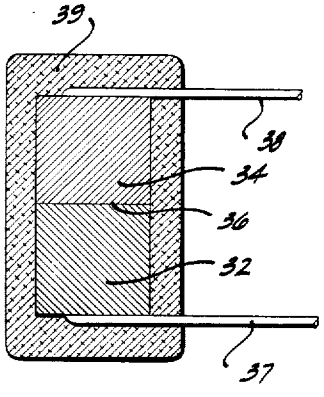
Fig. 3 is a plan view of a semiconductor device which illustrates one manner in which the P-N junction device shown in Fig. 2 may be enclosed in an envelope.

The P-N junction semiconductor devices produced by the methods of the present invention may be connected to suitable electrical conductors and enclosed in an envelope in numerous manners known to the art. Referring now to Fig. 3, there is shown one manner in which the junction-type semiconductors may be mounted and enclosed to form a unitary semiconductor device. A P-N junction semiconductor, of the type herein disclosed, including two germanium specimens 32 and 34 coalesced at a narrow barrier region 36, is secured, such as by soldering, to two electrical conductors 37 and 38, substantially as shown. The semiconductor is then enclosed in an envelope 39 which may be of any suitable material, such as a thermosetting plastic. It is understood, of course, that conductors 37 and 38 may be affixed to the semiconductor by other conventional methods, and that the semiconductor device shown in Fig. 3 is not intended as a limit to the invention.

The description of the present invention has thus far been limited to a single P-N junction semiconductor device and methods for making the device. However, the methods herein disclosed are equally applicable to the production of multiple junction semiconductor devices, such as transistors, and to the manufacture of a plurality of P-N junction semiconductor devices by merely carrying out the steps of the method once, as described below.

Figure 4:
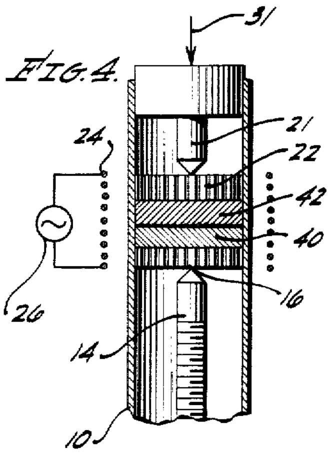
Fig. 4 is a schematic diagram, partly in section, of a modified apparatus for producing a modified junction-type semiconductor device according to the present invention.

Referring now to Fig. 4, there is shown a portion of an apparatus, similar to that described in connection with Fig. 1, for producing a P-N junction semiconductor device by utilizing two germanium wafers 40 and 42 as starting specimens. The only structural differences in the appartus here employed and that utilized in Fig. 1 is that tubular element 10 is of larger internal cross-sectional area in order to accommodate the large diameter of the wafers, and pressure pads 16 and 22 are in pivotal contact with rod 21 and stud 14, respectively, in order to ensure reasonably uniform pressure distribution across the interface of the germanium wafers.

In operation, pressure is applied to the germanium wafers by a force 31 of preselected magnitude, and the wafers are surrounded by a protective atmosphere, in the same manner as disclosed in Fig. 1. By applying a predetermined temperature to wafers 40 and 42 from coil 24, local melting of the wafers occurs parallel to and in the vicinity of the interface, thereby fusing wafer 40 to wafer 42 and producing a P-N junction semiconductor.

Figure 5:
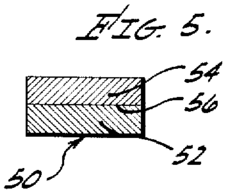
Fig. 5 is a sectional view of the device produced by the apparatus of Fig. 4.

Referring now to Fig. 5, there is shown a P-N junction semiconductor device, generally designated 50, which has been produced by performing the method of the present invention on two germanium wafers of opposite conductivity types. Junction device 50 includes two regions 52 and 54, of different conductivity types, respectively, and a narrow barrier region 56 therebetween. If desired, the P-N junction device may be diced perpendicular to barrier region 56 in order to produce a plurality of smaller P-N junction devices similar to the device shown in Fig. 2. If, on the other hand, an electrical application exists for a P-N junction having a comparatively high forward current rating, junction device 50 may be utilized directly or may be cut to a suitable size. It is to be understood, of course, that the device may also be connected to suitable electrical conductors and enclosed in an envelope, if desired.

In applying the methods of the present invention to the manufacture of multiple junction semiconductor devices such as P-N-P or N-P-N transistors, three germanium specimens may be coalesced by first coalescing two of the specimens of opposite conductivity type in the manner illustrated in Fig. 1, and then coalescing the third specimen with the region of the fused specimens which is of the conductivity type opposite to that of the third specimen. However, if desired, all three specimens may be coalesced simultaneously, as will now be described.

Figure 6:
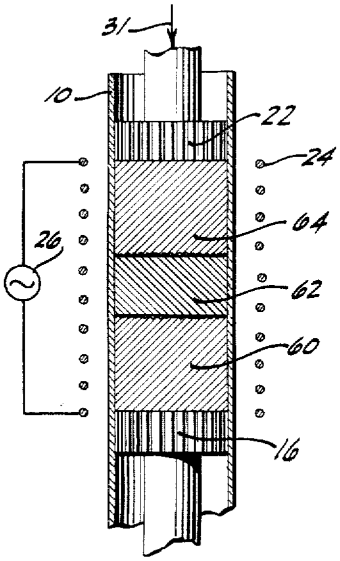
Fig. 6 is a schematic diagram, partly in section, of the apparatus of Fig. 1 for producing junction-type transistors according to the present invention.

Referring now to Fig. 6, a portion of the apparatus of Fig. 1 is shown having three germanium specimens 60, 62 and 64, respectively, positioned within tubular element 10 and between pressure pads 16 and 22. It may be recalled from the description of Fig. 1 that more uniform results are obtained from the methods of the present invention when the contact area between the semiconductor specimens to be coalesced is controlled, to a certain extent, by joining one specimen having a preselected microscopically coarse contact surface with a second specimen having a microscopically smooth contact surface. Although this expedient is generally applicable to the production of junction-type semiconductors according to this invention, it is particularly applicable to the production of transistors when the middle specimen is coalesced with both of the two end specimens simultaneously, since the pressure at each of the contacting interfaces should be substantially the same in order to coalesce all three specimens at the same value of temperature. Accordingly, specimens 60 and 64 are shown to have exaggeratedly coarse contact surfaces, whereas specimen 62 is shown to have contact surfaces which are smooth. It is understood, of course, that the contact surfaces of specimen 62 may be coarse and the contact surfaces of specimens 60 and 64 may be smooth.

In operation, heat and pressure are applied to specimens 60, 62, and 64 in the manner described in connection with Figs. 1 and 4, thereby fusing specimen 62 with specimens 60 and 64 at a narrow region adjacent each of the respective interfaces of the specimens. Again, as in the method of producing P-N junctions, according to this invention, local melting of the specimens at the interfaces is followed by an increase in the contact areas between the specimens and resolidification of the specimens as a junction-type transistor.

As set forth previously in the description of Fig. 1, the electrical characteristics and active impurity concentrations of P-N junctions produced by the methods of this invention may be controlled by the active impurity concentrations of the semiconductor specimens selected. Similarly, the electrical characteristics and active impurity concentrations of the N-type and P-type regions of transistors produced by the methods of this invention may be controlled by the active impurity concentrations of the starting specimens utilized. In this manner, the N-type and P-type regions of the transistors produced may be substantially free of active impurities of the undesired type. In addition, it is clear that transistors may be produced in which the active impurity concentrations of the P-type and N-type regions are of the same order of magnitude, or are related to each other by any predetermined ratio. Thus, either N-P-N or P-N-P transistors may be produced having an active impurity concentration in each of the three regions which is related to the active impurity concentrations of the other regions by predetermined ratios.

Figure 7:
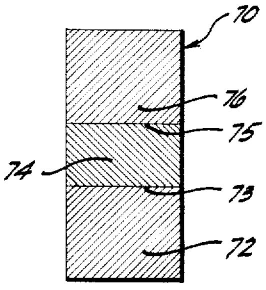
Fig. 7 is a longitudinal sectional view of the product resulting from the method illustrated in Fig. 6.

Referring now to Fig. 7, there is shown a junction-type transistor, generally designated 70, which has been produced by the methods of this invention. Transistor 70 includes two end regions 72 and 76 of similar conductivity type, and a central region 74 of conductivity type opposite to that of regions 72 and 76, and coalesced with regions 72 and 76 at two rectifying barrier regions 73 and 75, respectively. Suitable electrical conductors may, of course, be attached to transistor 70, and any of several conventional envelopes may be utilized for enclosing the transistor to provide a compact semiconductor device. It should be understood, however, that transistor 70 is merely illustrative and is not intended as a limit to the invention, since it is clear that the transistors produced may have N-type and P-type regions of varying length and cross-sectional area.

When it is desired to produce junction type transistors in which only the end regions have active impurity concentrations of the same order of magnitude, the methods of the present invention are applicable to the production of transistors from two semiconductor specimens having active impurity concentrations of one type by plating one of the specimens with an active impurity of the other type prior to coalescing the specimens.

Figure 8:
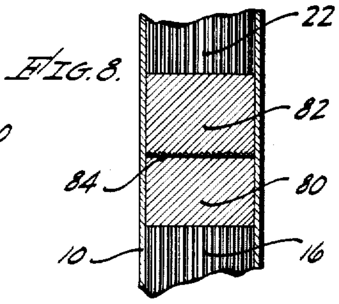
Fig. 8 is a schematic diagram, partly in section, of an apparatus for producing a modified form of junction-type transistor.

Referring now to Fig. 8, there is shown a portion of the apparatus of Fig. 1 having two semiconductor specimens 80 and 82 of similar conductivity type positioned within tubular element 10 and between pressure pads 16 and 22. Specimen 80 is plated with a thin layer 84 of an active impurity of the type opposite to that contained in specimens 80 and 82. In accordance with the aforementioned technique of controlling the contact area between the specimens, specimen 82 is microscopically coarse at the interface of the specimens in order to obtain more uniform results.

In operation, heat and pressure applied in accordance with the methods previously set forth produce local melting of specimens 80 and 82 adjacent the interface and also melt the plated active impurity 84, thereby alloying the melted portions of the semiconductor specimens with the active impurity. Upon resolidification of the specimens, therefore, a transistor is produced having end regions of similar conductivity type and active impurity concentrations, and a very narrow central or middle region of opposite conductivity type. It is clear, of course, that in lieu of plating an active impurity on specimen 80, a finely powdered active impurity may merely be deposited on specimen 80 before specimen 82 is placed in position for joining the specimens. Furthermore, the powder deposited may be a pure active impurity, or may be germanium having a relatively high concentration of the desired active impurity.

Although the description of the present invention discloses coalescence of semiconductor specimens by local melting adjacent a contacting interface of the specimens, it is obvious that the methods of the present invention are equally applicable to coalescing of the specimens by short-range diffusion or sintering of the specimens adjacent the interface. This may be accomplished by merely maintaining the semiconductor specimens at a preselected value of temperature, slightly below the value whereat local melting of the specimens occurs, until atomic rearrangement of the specimens at the interface coalesces the specimens.

Obviously, many modifications and variations of the present invention are possible in the light of the above teachings. It is, therefore, to be expressly understood that within the scope of the appended claims, the invention may be practiced otherwise than as specifically described.

What is claimed as new is:

1. The method of producing P-N junction semiconductor devices which comprises the steps of placing a relatively coarse surface of a first semiconductor specimen in contact with a relatively smooth surface of a second semiconductor specimen, stressing the first specimen against the second specimen, and heating the specimens to a temperature value whereat the first and second semiconductor specimens fuse with each other in the vicinity of the contact between the specimens.

2. The method of making junction-type transistors by joining first and second semiconductor specimens of one conductivity type with a third semiconductor specimen of the other conductivity type, said method comprising the steps of stressing the first and second semiconductor specimens against the third semiconductor specimen at opposite surfaces of the third semiconductor specimen, and heating the specimens to a value of temperature whereat the first and second specimens coalesce with the third specimen only at the respective opposite surfaces of the third specimen.

3. The method of making junction-type transistors by joining first and second semiconductor specimens of one conductivity type with a third semiconductor specimen of the other conductivity type, said method comprising the steps of sandwiching the third specimen between said first and second specimens with substantially equal pressures, and progressively raising the temperature of said specimens until local melting of the specimens occurs at the contacting interfaces therebetween.

References Cited in the file of this patent

UNITED STATES PATENTS

| | | |
|---|---|---|
| 710,958 | Emme | Oct. 14, 1902 |
| 1,114,350 | Collins | June 29, 1915 |
| 1,152,610 | De Bats | Sept. 7, 1915 |
| 2,129,410 | Dowling | Sept. 6, 1938 |
| 2,375,181 | Williams | May 1, 1945 |
| 2,504,628 | Benzer | Apr. 18, 1950 |
| 2,569,347 | Shockley | Sept. 25, 1951 |
| 2,602,211 | Scaff et al. | July 8, 1952 |
| 2,623,103 | Kircher | Dec. 23, 1952 |
| 2,629,672 | Sparks | Feb. 24, 1953 |
| 2,646,536 | Benzer et al. | July 21, 1953 |
| 2,671,156 | Douglas et al. | Mar. 2, 1954 |
| 2,701,326 | Pfann et al. | Feb. 1, 1955 |

UNITED STATES PATENT OFFICE
CERTIFICATE

Patent No. 2,743,201 Patented April 24, 1956

Ralph P. Johnson, Robert G. Shulman and Delbert M. Van Winkle

Application having been made jointly by Ralph P. Johnson, Robert G. Shulman and Delbert M. Van Winkle, the inventors named in the patent above identified, and Hughes Aircraft Company, a corporation of Delaware, the assignee, for the issuance of a certificate under the provisions of Title 35, Section 256 of the United States Code, deleting the name of the said Delbert M. Van Winkle from the patent as a joint inventor, and a showing and proof of facts satisfying the requirements of said section having been submitted, it is this 17th day of March, 1959, certified that the name of said Delbert M. Van Winkle is hereby deleted from the said patent as a joint inventor with Ralph P. Johnson and Robert G. Shulman.

[SEAL]

ARTHUR W. CROCKER,
*First Assistant Commissioner of Patents.*